(12) United States Patent
Kim

(10) Patent No.: US 7,042,785 B2  
(45) Date of Patent: May 9, 2006

(54) METHOD AND APPARATUS FOR CONTROLLING REFRESH CYCLES OF A PLURAL CYCLE REFRESH SCHEME IN A DYNAMIC MEMORY

(75) Inventor: Joonho Kim, Cary, NC (US)

(73) Assignee: Infineon Technologies, AG, Munich (DE)

( * ) Notice: Subject to any disclaimer, the term of this patent is extended or adjusted under 35 U.S.C. 154(b) by 180 days.

(21) Appl. No.: 10/739,071

(22) Filed: Dec. 19, 2003

(65) Prior Publication Data

US 2005/0135171 A1   Jun. 23, 2005

(51) Int. Cl.  
*G11C 7/00* (2006.01)

(52) U.S. Cl. .................... 365/222; 365/201

(58) Field of Classification Search .......... 365/222, 365/201  
See application file for complete search history.

(56) References Cited

U.S. PATENT DOCUMENTS

| 4,691,303 A | 9/1987 | Churchward et al. |
| 4,807,196 A | 2/1989 | Mizukami |
| 5,566,119 A | 10/1996 | Matano |
| 6,067,261 A | 5/2000 | Vogelsang et al. |
| 6,373,769 B1 | 4/2002 | Kiehl et al. |
| 6,542,425 B1 | 4/2003 | Nam |
| 6,603,694 B1 | 8/2003 | Frankowsky et al. |
| 6,614,704 B1 | 9/2003 | Dobler et al. |
| 6,762,967 B1 * | 7/2004 | Tanizaki et al. ............ 365/201 |
| 2003/0145163 A1 | 7/2003 | Seo et al. |

FOREIGN PATENT DOCUMENTS

EP   0 239 916 B1   6/1994

* cited by examiner

*Primary Examiner*—Van Thu Nguyen  
(74) *Attorney, Agent, or Firm*—Edell, Shapiro and Finnan, LLC

(57) ABSTRACT

According to the present invention, refresh operation of a device employing a plural refresh cycle scheme is controlled. The refresh scheme employed by the device performs a plurality of refresh cycles of a predetermined quantity in response to a command initiating a refresh operation to maintain data storage. The present invention includes a mode generator that supplies information relating to a desired quantity of refresh cycles to be performed in response to the refresh initiating command and a refresh enable unit that controls the device to perform the desired quantity of refresh cycles within the refresh scheme in response to the refresh initiating command.

48 Claims, 6 Drawing Sheets

METHOD AND APPARATUS FOR CONTROLLING REFRESH CYCLES OF A PLURAL CYCLE REFRESH SCHEME IN A DYNAMIC MEMORY

BACKGROUND OF THE INVENTION

1. Technical Field

The present invention pertains to dynamic random access memories (DRAM). In particular, the present invention pertains to a refresh control unit for dynamic random access memories that controls the quantity of refresh cycles performed in a plural refresh cycle scheme for a refresh command.

2. Discussion of Related Art

Generally, a dynamic random access memory (DRAM) includes a plurality of memory cells each including one or more transistors and a data storage capacitor. The cells are typically arranged into one or more memory banks, with each bank in the form of a matrix of rows and columns. Since the respective charges of the cells are allowed to leak, the memory cells must be refreshed periodically to prevent data loss. A refresh operation typically selects one word line or row based on the content of a refresh address counter, where the memory cells connected to the selected word line are refreshed. The refresh operation may be initiated by an auto-refresh or automatically generated refresh command. This command may be generated internally (e.g., internal memory controller, etc.) or by an external source (e.g., controller, processor, etc.) and is associated with a particular quantity of memory rows or word lines to be refreshed.

A single cycle refresh scheme is generally employed where only one row or word line is refreshed (e.g., one refresh cycle occurs) in response to an auto-refresh command. However, some dynamic memory devices require a greater number of row addresses to be refreshed in response to an auto-refresh command than that accommodated by the corresponding command refresh cycle. In order to comply with refresh requirements, plural row addresses may be accessed with an auto-refresh command. The plural addresses may be accessed in a parallel or consecutive manner. With respect to consecutive access, one or more internal refresh commands are generated in response to the initial auto-refresh command in order to automatically perform successive refresh operations.

An example of a conventional dynamic memory device employing a two cycle refresh scheme is illustrated in FIG. 1. In particular, the dynamic memory device includes a state machine 10, a row control block 20, an internal refresh command generator 30, a refresh control circuit 32 and one or more memory banks 34 each with corresponding row and column decoders 36, 38. The state machine basically serves as an instruction decoder and receives an auto-refresh command. This command may be generated internally (e.g., by a test mode generator, memory controller, etc.) or received from an external source (e.g., processor utilizing the memory device, controller, etc.) The state machine is coupled to row control block 20 and internal refresh command generator 30 and provides a refresh signal (REFRESH) in an active or high logic level state to these devices in response to decoding an auto-refresh command. The row control block generates a row refresh signal (ROW_ACT_PCG) in an active or high logic level state that is provided to refresh circuit 32 to facilitate refreshing of a corresponding word line or row in one or more memory banks 34. Row decoder 36 accesses a row in the associated memory bank corresponding to a received address. The received address may be a refresh address for a refresh operation or an address of a desired memory location for a read and/or write operation. Column decoder 38 similarly accesses a column in the associated memory bank corresponding to a received address for the read and/or write operation. The refresh control circuit typically includes a refresh address counter 33 to provide the address of the corresponding word line or row to row decoders 36 of the appropriate memory banks in order to accomplish refresh of that row.

The internal refresh command generator produces an internal refresh command to initiate the second refresh cycle for the auto-refresh command to refresh an additional memory row or word line as described below. The above devices are typically implemented by conventional components (e.g., circuitry, decoders, state machines, logic, processors, etc.). For examples of conventional dynamic random access memory device configurations, reference is made to U.S. Pat. No. 6,373,769 (Kiehl et al), U.S. Pat. No. 6,603,694 (Frankowsky et al) and U.S. Pat. No. 6,614,704 (Dobler et al), the disclosures of which are incorporated herein by reference in their entireties.

The operation of the dynamic memory device is described with respect to the timing diagram illustrated in FIG. 2. Specifically, state machine 10 (FIG. 1) receives an external auto-refresh command (REF) and produces a positive pulse or activates a refresh signal (REFRESH) to commence an initial refresh cycle. The refresh signal is provided to row control block 20 and internal command generator 30. The active refresh signal enables the internal refresh command generator, and further enables the row control block to produce a row refresh signal (ROW_ACT_PCG) in an active or high logic level state. The active row refresh signal initiates the first refresh cycle and enables refresh control circuit 32 to refresh an associated memory row or word line. The word line is activated for a particular time interval or delay (tRAS) that is typically monitored by an internal timer. After the activation time interval (tRAS), the row refresh signal (ROW_ACT_PCG) enters a precharge or low logic level state automatically.

The row refresh signal (ROW_ACT_PCG) is further provided to internal refresh command generator 30, where the falling edge of the row refresh signal enables the internal command generator to produce a positive pulse or internal refresh signal (REF_INT) in an active or high logic level state. The internal refresh signal is generated automatically after another time interval or delay (tRP) to initiate a second refresh cycle. This time interval represents the delay needed between successive activations of word lines and is typically monitored by a second internal timer.

The row control block receives the active internal refresh signal (REF_INT) and activates the row refresh signal (ROW_ACT_PCG) to a high logic level state to initiate a refresh operation on a succeeding memory row or word line as described above. The internal refresh command generator is disabled in response to the active internal refresh signal since the auto-refresh command initiates a first refresh cycle and the internal refresh command initiates the second refresh cycle.

The row refresh signal (ROW_ACT_PCG) enters a precharge or low logic level state automatically after a time delay (tRAS) as described above. However, the falling edge of the row refresh signal does not facilitate activation of the internal refresh signal (REF_INT) since the internal command generator is disabled. Accordingly, the refresh operation is complete, where two refresh cycles are performed in response to an auto-refresh command. For an example of a plural cycle refresh scheme in a dynamic random access memory device, reference is made to U.S. Pat. No. 5,566, 119 (Matano), the disclosure of which is incorporated herein by reference in its entirety.

The plural cycle refresh scheme described above has some difficulty in accommodating test methods employing single cycle refresh schemes since the successive row activations occur automatically. Generally, an auto-refresh command activates a greater number of word lines than an active row command. Thus, some test methods employ the auto-refresh command instead of an active row command for word line activation in order to achieve enhanced test efficiency. In order to use the auto-refresh command in the manner of a normal active row command, the active and precharged timing should be controlled externally. However, the auto-refresh command always enables the internal refresh command generator in the plural cycle refresh scheme described above, thereby precluding control of the successive row active timing. Thus, previously developed efficient test methods are generally not compatible with the plural cycle auto-refresh scheme or their use with such schemes is extremely complex.

The present invention provides a manner to control the quantity of refresh cycles in a plural cycle refresh scheme and may be utilized to alleviate the aforementioned problems.

SUMMARY OF THE INVENTION

According to the present invention, a dynamic memory device employing a plural cycle refresh scheme includes a refresh cycle control block to selectively control the quantity of refresh cycles performed in response to an auto-refresh command. The refresh cycle control block controls generation and/or performance of internally generated refresh commands, thereby controlling the quantity of refresh cycles performed for the auto-refresh command.

The present invention provides several advantages. In particular, the present invention controls generation of internal refresh cycles. This enables the present invention to disable a plural refresh cycle scheme in a test mode, where a test procedure requires a single refresh cycle in response to an auto-refresh command. The present invention enables utilization of test methods employing an auto-refresh command regardless of the refresh cycle scheme employed. In addition, the present invention maximizes the functional safety of the memory device for those test methods.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

Figure 1:
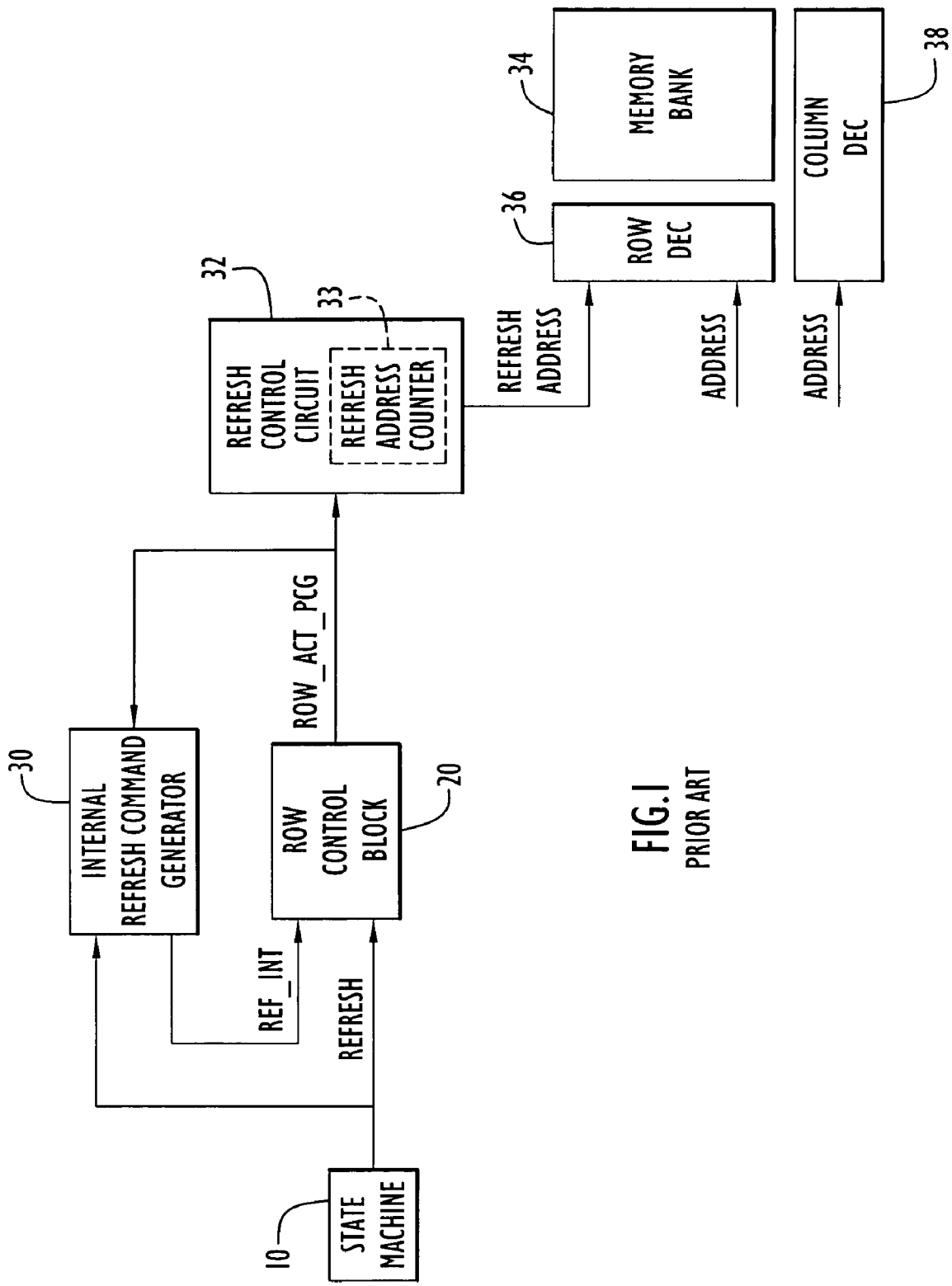
FIG. 1 is a block diagram of a conventional dynamic memory device employing a two cycle refresh scheme.
Figure 2:
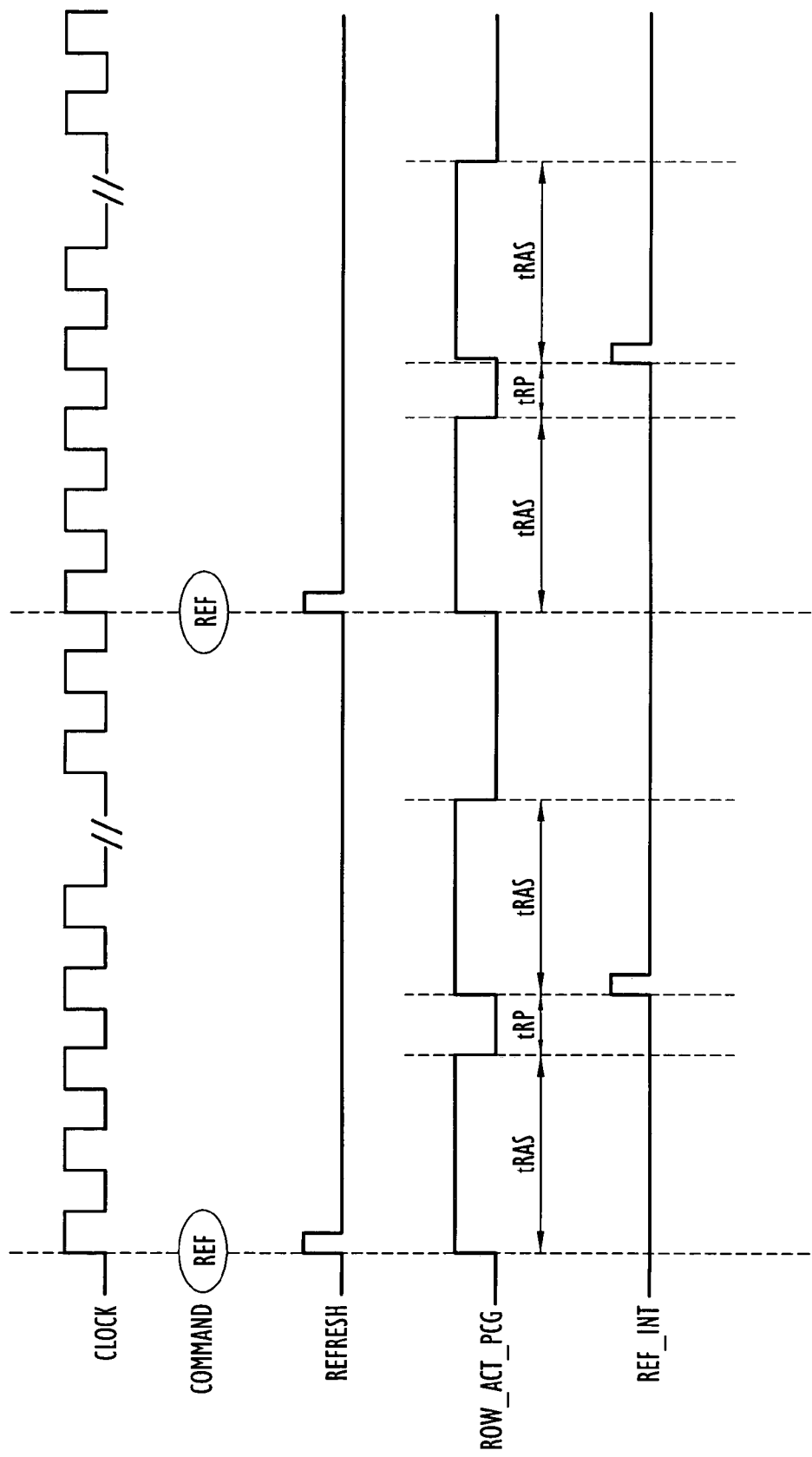
FIG. 2 is a graphical illustration of a signal timing diagram for the device of FIG. 1.
Figure 3:
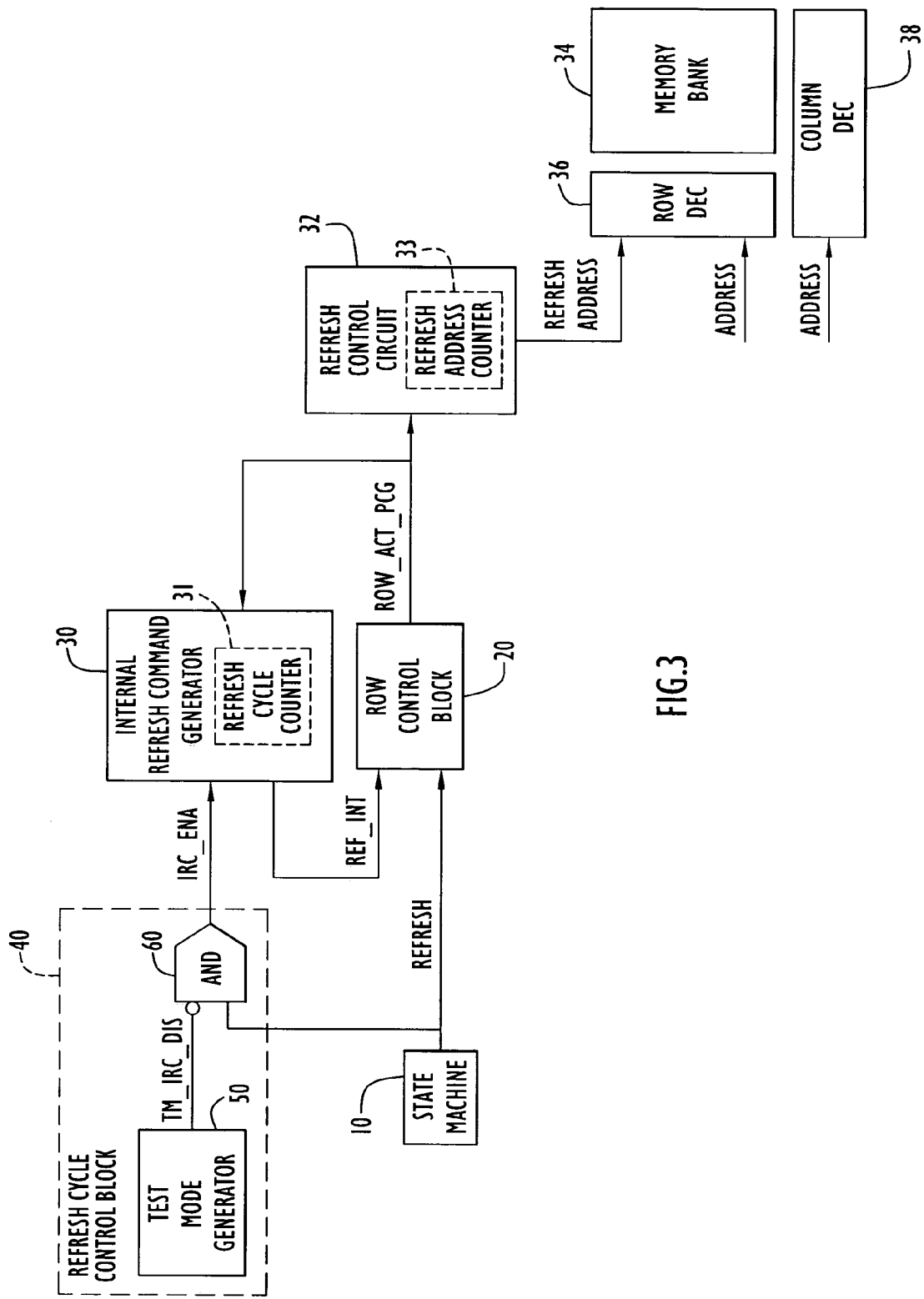
FIG. 3 is a block diagram of a dynamic memory device employing control of refresh cycles in a plural cycle refresh scheme according to the present invention.

The present invention enables selective control of the quantity of refresh cycles performed in response to an auto-refresh command within a dynamic memory device (e.g., dynamic random access memory (DRAM)). The control is preferably implemented in a memory test mode and in accordance with the purposes of memory tests. An exemplary dynamic memory device employing control of the quantity of refresh cycles performed in response to an auto-refresh command according to the present invention is illustrated in FIG. 3. Specifically, the dynamic memory device includes state machine 10, row control block 20, internal refresh command generator 30, refresh control circuit 32 and one or more memory banks 34 each with corresponding row and column decoders 36, 38. These components are substantially similar to the components described above with respect to FIG. 1. In order to selectively control the quantity of refresh cycles, the memory device further includes a refresh cycle control block 40. State machine 10 is coupled to row control block 20 and refresh cycle control block 40 and decodes instructions for the memory that may be generated internally (e.g., by a test mode generator, memory controller, etc.) or received from an external source (e.g., an external processor, controller, etc.). The state machine produces a positive pulse or refresh signal (REFRESH) in an active or high logic level state in response to decoding an auto-refresh command as described above. The refresh signal is provided to row control block 20 and refresh cycle control block 40.

The row control block is further coupled to internal refresh command generator 30 and receives refresh (REFRESH) and internal refresh (REF_INT) signals as described above. The row control block produces a row refresh signal (ROW_ACT_PCG) in an active or high logic level state in response to active refresh or internal refresh signals (e.g., in response to refresh or internal refresh commands). The row refresh signal is provided to refresh control circuit 32. The active row refresh signal enables the refresh control circuit to initiate refreshing of a corresponding word line or row in one or more memory banks 34 as described above. Basically, row decoder 36 accesses a row in the associated memory bank corresponding to a received address. The received address may be a refresh address for a refresh operation or an address of a desired memory location for a memory read and/or write operation. Column decoder 38 similarly accesses a column in the associated memory bank corresponding to a received address for the read and/or write operation. The refresh control circuit typically includes refresh address counter 33 to provide the address of the corresponding word line or row to row decoders 36 of the appropriate memory banks in order to accomplish refresh of that row.

The row refresh signal (ROW_ACT_PCG) is further provided to internal refresh command generator 30, where the active row refresh signal enables the internal refresh command generator to produce internal refresh commands. These commands initiate plural refresh cycles for the auto-refresh command to refresh plural memory rows or word lines as described below. The internal command generator includes a refresh cycle counter 31 that maintains the quantity of refresh cycles performed. The counter is reset in response to each auto-refresh command and is incremented based on generation of each internal refresh command. When the desired quantity of refresh cycles is achieved as determined by the refresh cycle counter, the internal command generator is disabled to prevent further refresh cycles.

The internal refresh command generator is further coupled to refresh cycle control block 40. The refresh cycle control block produces an internal refresh enable signal (IRC_ENA) to control generation of the internal refresh commands by the internal refresh command generator. The refresh cycle control block includes a test mode generator 50 and logic 60. The test mode generator is preferably implemented by conventional components (e.g., a memory, circuitry, processor, etc.) and includes information to conduct particular memory tests. In this case, the test mode generator provides information with respect to the quantity of refresh cycles to be performed during corresponding tests and/or memory device operation. The test mode generator produces a test mode refresh signal (TM_IRC_DIS) that is provided to logic 60. The logic further receives the refresh signal (REFRESH) produced by state machine 10 and generates the internal refresh enable signal (IRC_ENA) provided to the internal refresh command generator. Logic 60 includes an inverted input with respect to the test mode refresh signal (TM_IRC_DIS); however, the logic may include any inputs in inverted or non-inverted states. Logic 60 is preferably implemented in the form of AND type logic and may be implemented by any conventional or other logic devices (e.g., gates, transistors, circuitry, processor, etc.).

Accordingly, when the test mode refresh signal (TM_IRC_DIS) is active or in a high logic level state to indicate single refresh cycle operation, a low logic level signal is received at the inverted input of logic 60. In response to the low logic level input signal, logic 60 produces a low logic level internal refresh enable signal (IRC_ENA) that disables internal refresh command generator 30 to prevent generation of internal refresh commands, thereby limiting the memory device to a single refresh cycle for an auto-refresh command. In the event that the plural refresh cycle scheme is desired for a test or memory device operation, the test mode generator generates the test mode refresh signal (TM_IRC_DIS) in a low logic level or disabled state. This produces an active or high logic level signal at the inverted input of logic 60. Logic 60 produces an active or high logic level internal refresh enable signal (IRC_ENA) to enable the internal refresh command generator in response to an active refresh signal (REFRESH) produced by state machine 10. In this case, the plural cycle refresh scheme operates to perform plural refresh cycles for an auto-refresh command as described below.

Figure 4:
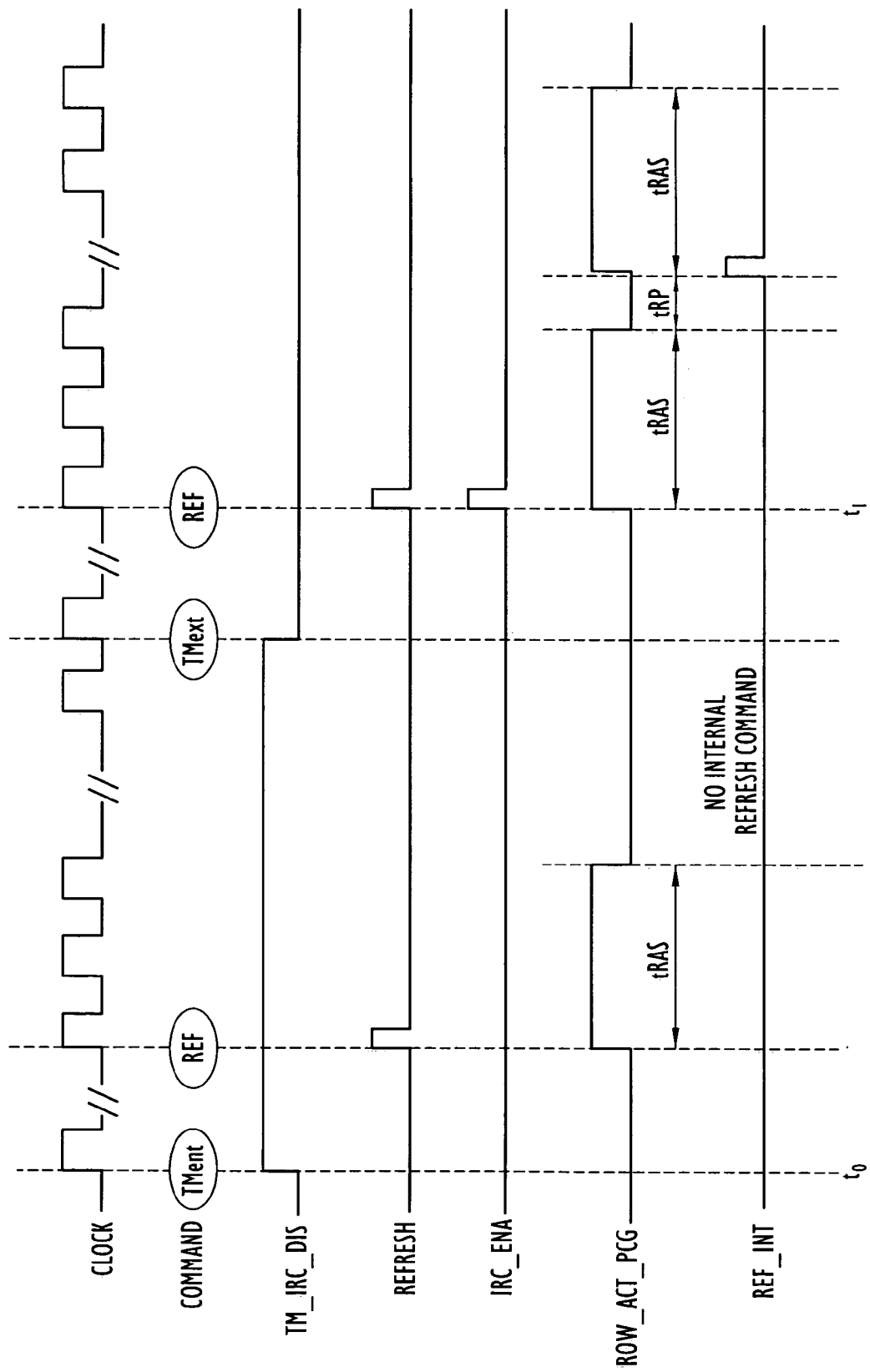
FIG. 4 is a graphical illustration of a signal timing diagram of the memory device of FIG. 3.

Operation of the dynamic memory device according to the present invention is described with reference to the timing diagram illustrated in FIG. 4. By way of example only, the memory device operation is described with respect to a two cycle refresh scheme. However, the dynamic memory device may employ any quantity of refresh cycles for an auto-refresh command. Initially, the dynamic memory device may include one or more test mode generators 50 (FIG. 3), each providing information corresponding to a particular test. The test mode generators may be combined in any fashion to provide information to perform a desired test. Test mode generator 50 is associated with the quantity of refresh cycles performed in response to an auto-refresh command and may be utilized in combination with any quantity of other test mode generators to conduct a particular test.

With respect to a test employing a single cycle refresh scheme (e.g., starting at time $t_0$ in FIG. 4), a test mode entry command (TMent) is received and the test mode generator produces the test mode refresh signal (TM_IRC_DIS) in an active or high logic level state. This signal is inverted at the input of logic 60, thereby producing a low logic level signal at the logic inverted input. State machine 10 receives an external auto-refresh command (REF) and produces a positive pulse or high logic level refresh signal (REFRESH) to commence a refresh cycle. The refresh signal is provided to row control block 20 and logic 60. Since logic 60 includes AND type logic, the low logic level signal at the logic inverted input (e.g., the high logic level TM_IRC_DIS signal is inverted at the logic input as described above) results in an internal refresh enable signal (IRC_ENA) in a low logic level or disabled state. This disables the internal refresh command generator and prevents generation of internal refresh commands.

The row control block receives the active refresh signal (REFRESH) and produces a row refresh signal (ROW_ACT_PCG) in an active or high logic level state to initiate a refresh cycle and enable refresh control circuit 32 to refresh an associated memory row or word line. The word line is activated for a particular time interval or delay (tRAS) that is typically monitored by an internal timer as described above. After the activation time interval (tRAS), the row refresh signal (ROW_ACT_PCG) enters a precharge or low logic level state automatically.

The row refresh signal (ROW_ACT_PCG) is further provided to internal command generator 30, where the falling edge of the row refresh signal usually enables the internal command generator to produce a positive pulse or internal refresh signal (REF_INT) in an active or high logic level state. However, since the internal refresh command generator is disabled by the internal refresh enable signal (IRC_ENA) generated by refresh cycle control block 40, the internal refresh command generator does not generate an internal refresh command (e.g., does not produce a high logic level internal refresh signal (REF_INT)) to initiate a subsequent refresh cycle. Thus, one refresh cycle is performed in response to an auto-refresh command and the test mode may be terminated upon receipt of a test mode exit command (TMext).

When a plural refresh cycle scheme is desired for operation or testing (e.g., starting at time $t_1$ in FIG. 4), test mode generator 50 produces the test mode refresh signal (TM_IRC_DIS) in a low logic level or disabled state. This signal is inverted at the input of logic 60, thereby producing an active or high logic level signal at the logic inverted input. State machine 10 receives an external auto-refresh command (REF) and produces a positive pulse or an active or high logic level refresh signal (REFRESH) to commence a refresh cycle. The refresh signal is provided to row control block 20 and logic 60. Since logic 60 includes AND type logic, the high logic level signal at the logic inverted input (e.g., the low logic level TM_IRC_DIS signal is inverted at the logic input as described above) results in an internal refresh enable signal (IRC_ENA) that follows the refresh signal. In other words, the logic produces a high logic level signal in response to an auto-refresh command. The active internal refresh enable signal (IRC_ENA) enables the internal refresh command generator to reset refresh cycle counter 31 and to generate internal refresh commands as described below. Thus, internal refresh command generator 30 is enabled in response to an auto-refresh command to perform plural refresh cycles.

The row control block receives the active refresh signal and produces a row refresh signal (ROW_ACT_PCG) in an active or high logic level state to initiate the first refresh cycle and enable refresh control circuit 32 to refresh an associated memory row or word line. The word line is activated for a particular time interval or delay (tRAS) that is typically monitored by an internal timer as described above. After the activation time interval (tRAS), the row refresh signal enters a precharge or low logic level state automatically.

The row refresh signal (ROW_ACT_PCG) is further provided to internal command generator 30, where the falling edge of the row refresh signal enables the internal command generator to increment refresh cycle counter 31 and to produce a positive pulse or internal refresh signal (REF_INT) in an active or high logic level state. The internal refresh signal is generated automatically after another time interval or delay (tRP) to initiate a second refresh cycle. This time interval represents the delay needed between successive activations of word lines and is typically monitored by a second internal timer as described above.

The row control block receives the active internal refresh signal (REF_INT) and produces the row refresh signal (ROW_ACT_PCG) in an active or high logic level state to initiate a refresh operation on a succeeding memory row or word line as described above. The internal refresh command generator is disabled in response to the appropriate quantity of active internal refresh signals produced (e.g., as indicated by the refresh cycle counter) to facilitate the desired number of refresh cycles for an auto-refresh command. In this example of a two refresh cycle scheme, the internal command generator is disabled in response to the first active internal refresh signal since the auto-refresh command initiates a first refresh cycle and the internal refresh command initiates the second refresh cycle.

The row refresh signal (ROW_ACT_PCG) enters a precharge or low logic level state automatically after a time delay (tRAS) as described above. However, the falling edge of the row refresh signal does not facilitate activation of the internal refresh signal (REF_INT) since the internal command generator is disabled. Accordingly, the refresh operation is complete, where two refresh cycles are performed in response to an auto-refresh command.

The aforementioned embodiment of the present invention may be utilized for any quantity of refresh cycles in a plural cycle refresh scheme in substantially the same manner described above, and basically enables or disables performance of plural refresh cycles for an auto-refresh command. For example, if there are N refresh cycles performed for an auto-refresh command, the above-described embodiment enables selection of a single refresh cycle or of N refresh cycles to be performed for an auto-refresh command. An alternative embodiment of the present invention enables selection of any quantity of refresh cycles within the range of a plural cycle refresh scheme to be performed for an auto-refresh command. By way of example, if a plural refresh scheme includes M refresh cycles for an auto-refresh command, the alternative embodiment of the present invention enables selection of any quantity of refresh cycles for an auto-refresh command in the range of 1 to M.

Figure 5:
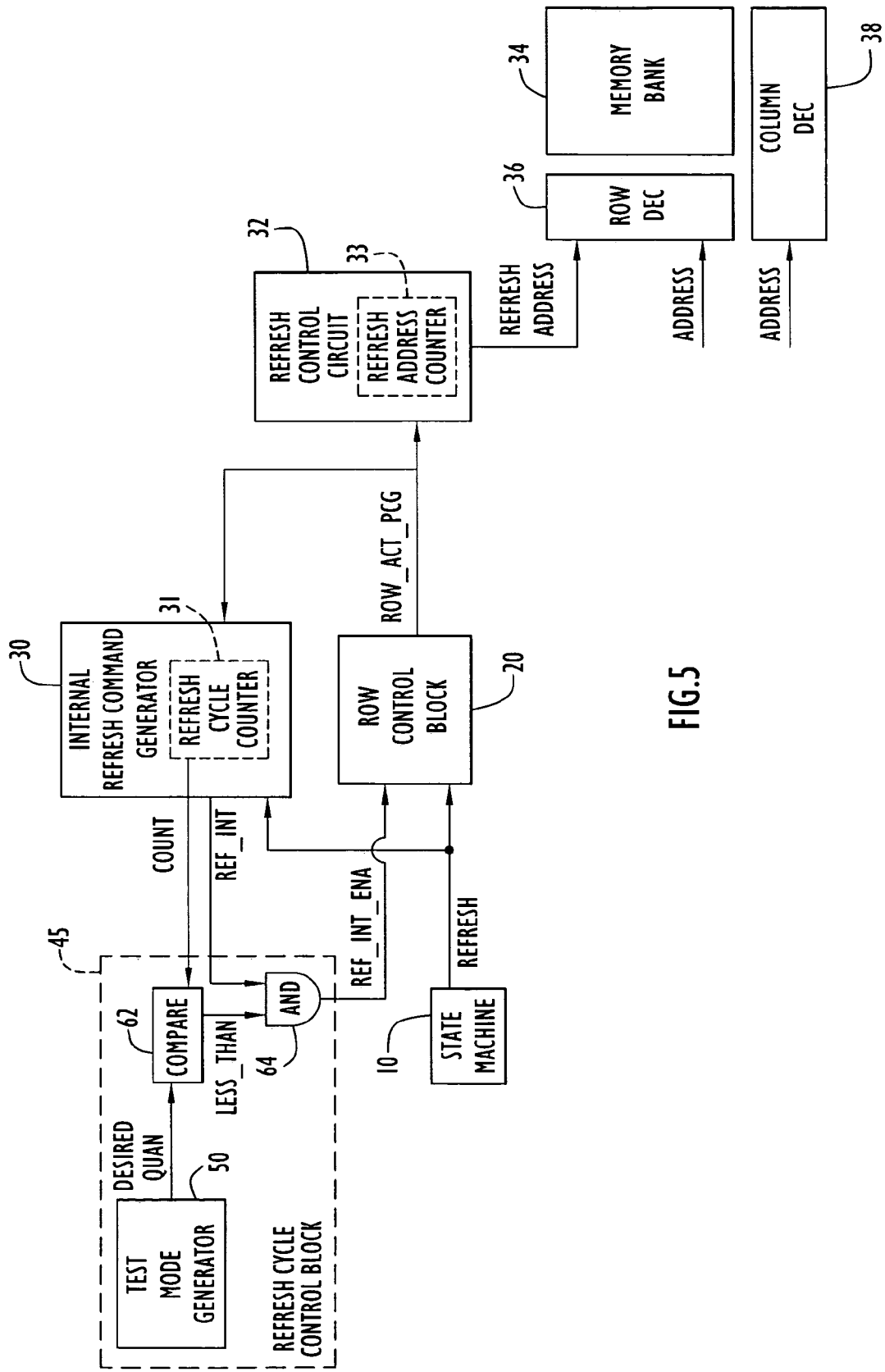
FIG. 5 is a block diagram of an alternative embodiment of a dynamic memory device employing control of refresh cycles in a plural refresh cycle scheme according to the present invention.

An exemplary dynamic memory device employing control of the quantity of refresh cycles in the range of a plural refresh cycle scheme according to the present invention is illustrated in FIG. 5. Specifically, the dynamic memory device includes state machine 10, row control block 20, internal refresh command generator 30, refresh control circuit 32 and one or more memory banks 34 each with corresponding row and column decoders 36, 38. These devices are substantially similar to the corresponding devices described above. In order to selectively control the quantity of refresh cycles, the memory device further includes a refresh cycle control block 45. State machine 10 is coupled to row control block 20 and internal refresh command generator 30 and decodes instructions for the memory that may be generated internally (e.g., by a test mode generator, memory controller, etc.) or received from an external source (e.g., an external processor, controller, etc.) as described above. The state machine produces a positive pulse or refresh signal (REFRESH) in an active or high logic level state in response to decoding an auto-refresh command as described above. The refresh signal is provided to row control block 20 and internal command generator 30.

The row control block is further coupled to refresh cycle control block 45 and receives refresh (REFRESH) and internal refresh cycle enable (REF_INT_ENA) signals. The row control block produces a row refresh signal (ROW_ACT_PCG) in an active or high logic level state in response to active refresh or internal refresh cycle enable signals (e.g., in response to refresh or internal refresh commands). The active row refresh signal is provided to refresh circuit 32 to initiate refreshing of a corresponding word line or row in one or more memory banks 34 as described above. The refresh control circuit includes refresh address counter 33 to provide the address of the corresponding word line or row to row decoders 36 of the appropriate memory banks in order to accomplish refresh of that row.

The row refresh signal (ROW_ACT_PCG) is further provided to internal refresh command generator 30, where the active row refresh signal enables the internal command generator to produce an internal refresh signal (REF_INT) in an active or high logic level state. This signal is utilized to initiate plural refresh cycles for the auto-refresh command to refresh plural memory rows or word lines as described below. The internal command generator includes refresh cycle counter 31 that maintains the quantity of refresh cycles performed as described above. The counter is reset in response to each auto-refresh command and is incremented based on generation of each internal refresh command. When the predetermined quantity of refresh cycles for the plural cycle refresh scheme is achieved as determined by the refresh cycle counter, the internal command generator is disabled to prevent further refresh cycles. Alternatively, the internal refresh command generator may be disabled in response to inactivity (e.g., no active row refresh signals) during a predetermined time interval. The time interval may be monitored by an internal timer.

The internal refresh command generator is further coupled to refresh cycle control block 45. The refresh cycle control block receives the count of the refresh cycle counter and the internal refresh signal (REF_INT) from the internal refresh command generator to produce an internal refresh cycle enable signal (REF_INT_ENA) that selectively enables performance of generated internal refresh commands. The refresh cycle control block includes a test mode generator 50, a compare unit 62 and logic 64. The test mode generator is substantially similar to the test mode generator described above. Test mode generator 50 is preferably implemented by conventional components (e.g., a memory, circuitry, processor, etc.) and includes information to conduct particular memory tests. In this case, the test mode generator provides information with respect to the quantity of refresh cycles to be performed during corresponding tests and/or memory device operation. The test mode generator provides the desired quantity of refresh cycles (DESIRED QUAN) to compare unit 62. The compare unit further receives the refresh cycle count (COUNT) produced by refresh cycle counter 31 of the internal refresh command generator and generates a comparison signal (LESS_THAN) in an active or high logic level state in response to the number of refresh cycles performed (COUNT) being less than the desired quantity of refresh cycles (DESIRED QUAN). The compare unit may be implemented by any conventional or other devices (e.g., logic, comparator, processor, etc.). The resulting comparison signal (LESS_THAN) and the internal refresh signal (REF_INT) from the internal refresh command generator are provided to logic 64. Logic 64 is preferably implemented in the form of AND type logic and may be implemented by any conventional or other logic devices (e.g., gates, transistors, circuitry, processor, etc.).

Accordingly, when the quantity of refresh cycles performed is greater than or equal to the desired quantity, the compare unit produces a comparison signal (LESS_THAN) in a low logic level or disabled state. In response to the low logic level input signal, logic 64 produces a low logic level internal refresh cycle enable signal (REF_INT_ENA) that prevents performance of additional refresh cycles, thereby limiting the memory device to the desired quantity of refresh cycles for an auto-refresh command. In the event that the quantity of desired refresh cycles has not been reached, the compare unit produces a comparison signal (LESS_THAN) in an active or high logic level state. Since logic 64 includes AND type logic, the high logic level comparison signal at the logic input results in an internal refresh cycle enable signal (REF_INT_ENA) that follows the internal refresh signal (REF_INT). In other words, the logic produces a high logic level signal in response to an internal refresh command to initiate an additional refresh cycle.

Figure 6:
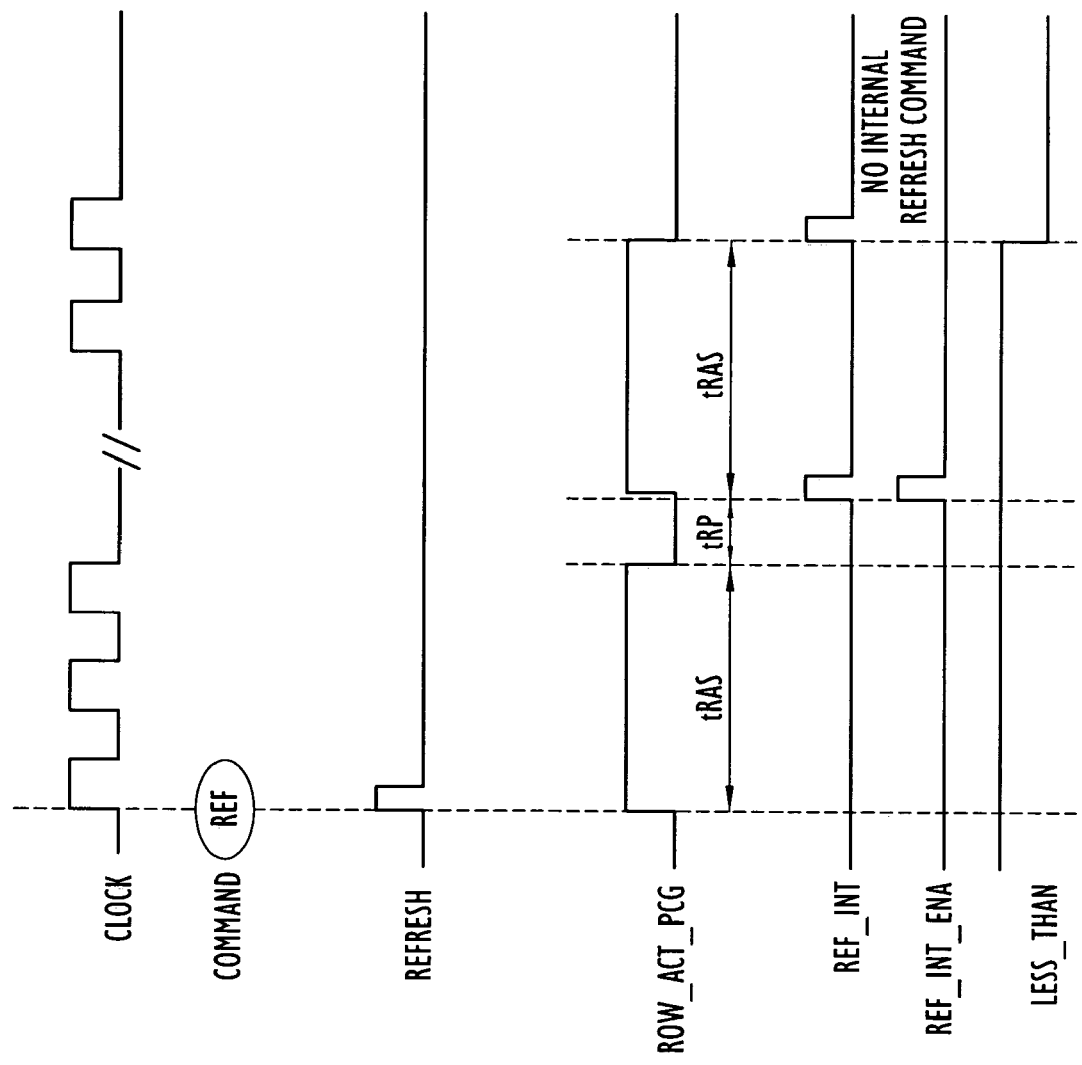
FIG. 6 is a graphical illustration of a signal timing diagram of the memory device of FIG. 5.

Operation of the dynamic memory device according to the present invention is described with reference to the timing diagram illustrated in FIG. 6. By way of example only, the memory device operation is described with respect to a three cycle refresh scheme, where two of the three refresh cycles are desired for each auto-refresh command. However, the dynamic memory device may employ any plural cycle refresh scheme with any quantity of refresh cycles desired for an auto-refresh command. Initially, the dynamic memory device may include one or more test mode generators 50 (FIG. 5), each providing information corresponding to a particular test. The test mode generators may be combined in any fashion to provide information to perform a desired test. Test mode generator 50 is associated with the quantity of refresh cycles performed in response to an auto-refresh command and may be utilized in combination with any quantity of other test mode generators to conduct a particular test.

When a plural refresh cycle scheme is desired for operation or testing, test mode generator 50 provides the desired quantity of refresh cycles (DESIRED QUAN) to an input of compare unit 62, while the compare unit further receives the refresh cycle count (COUNT) from refresh cycle counter 31 of the internal refresh command generator. State machine 10 receives an external auto-refresh command (REF) and produces a positive pulse or active or high logic level refresh signal (REFRESH) to commence a refresh cycle. The refresh signal is provided to row control block 20 and internal command generator 30. The active refresh signal (REFRESH) enables the internal refresh command generator to reset refresh cycle counter 31 and to generate internal refresh commands as described below. Thus, internal refresh command generator 30 is enabled in response to an auto-refresh command to perform plural refresh cycles.

The row control block receives the active refresh signal and produces a row refresh signal (ROW_ACT_PCG) in an active or high logic level state to initiate the first refresh cycle and enable refresh control circuit 32 to refresh an associated memory row or word line. The word line is activated for a particular time interval or delay (tRAS) that is typically monitored by an internal timer as described above. After the activation time interval (tRAS), the row refresh signal enters a precharge or low logic level state automatically.

The row refresh signal (ROW_ACT_PCG) is further provided to internal command generator 30, where the falling edge of the row refresh signal enables the internal command generator to increment refresh cycle counter 31 and to produce a positive pulse or internal refresh signal (REF_INT) in an active or high logic level state (e.g., thereby producing an internal refresh command). The internal refresh signal is generated automatically after another time interval or delay (tRP) to initiate a second refresh cycle. This time interval represents the delay needed between successive activations of word lines and is typically monitored by a second internal timer as described above.

Logic 64 receives the comparison signal (LESS_THAN) and the active internal refresh signal (REF_INT). In this example, since the count of the refresh cycle counter for the initial cycle is less than the desired quantity of refresh cycles (e.g., two cycles), compare unit 62 generates an active or high logic level comparison signal (LESS THAN). Since logic 64 includes AND type logic, the high logic level comparison signal at the logic input results in an internal refresh cycle enable signal (REF_INT_ENA) that follows the internal refresh signal (REF_INT). In other words, the logic produces a high logic level signal in response to an internal refresh command to enable performance of the internal refresh command and initiate an additional refresh cycle.

The row control block receives the active internal refresh cycle enable signal (REF_INT_ENA) and produces the row refresh signal (ROW_ACT_PCG) in an active or high logic level state to initiate a second refresh operation on a succeeding memory row or word line as described above. The row refresh signal (ROW_ACT_PCG) is further provided to internal command generator 30, where the falling edge of the row refresh signal enables the internal command generator to increment refresh cycle counter 31 and to produce a positive pulse or internal refresh signal (REF_INT) in an active or high logic level state as described above.

Logic 64 receives the comparison signal (LESS_THAN) and the active internal refresh signal (REF_INT). In this example, since the count of the refresh cycle counter for the second cycle is equal to the desired quantity of refresh cycles (e.g., two cycles), compare unit 62 generates a low logic level or disabled comparison signal (LESS THAN). In response to the low logic level input signal, logic 64 produces a low logic level or disabled internal refresh cycle enable signal (REF_INT_ENA), thereby preventing performance of additional refresh cycles. The internal refresh command generator may subsequently become disabled in response to inactivity (e.g., no active row refresh signals) during the predetermined time interval as described above. Accordingly, the refresh operation is complete, where two refresh cycles are performed for a three cycle refresh scheme. The present invention may be utilized to perform any quantity of refresh cycles for any plural cycle refresh scheme in substantially the same manner described above, where the desired quantity of refresh cycles is supplied by test mode generator 50.

It will be appreciated that the embodiments described above and illustrated in the drawings represent only a few of the many ways of implementing a method and apparatus for controlling refresh cycles of a plural cycle refresh scheme in a dynamic memory.

The present invention may be applied to any types of memory or other devices performing refresh operations to control refresh cycles. The present invention may be utilized with any types of commands initiating a refresh operation, and may control a refresh operation to perform any quantity of refresh cycles for the command. The refresh cycle control may be employed for testing, operational or other device modes. The present invention may be implemented in the analog and/or digital domain to control refresh cycles. The signals described above may include any types of labels and may be of any types of signals (e.g., analog, digital, pulses, etc.).

The state machine may be implemented by any quantity of any conventional or other devices (e.g., processor, decoders, logic, circuitry, etc.) and may decode any suitable instructions. The state machine may generate any type of signal (e.g., analog, digital, pulses, etc.) in any state (e.g., high, low, any voltage level, etc.) to indicate identification of a desired instruction. The state machine may receive instructions from any quantity of any desired internal or external sources (e.g., controller, test mode generator, processor, circuitry, etc.).

The row control block may be implemented by any quantity of any conventional or other devices (e.g., processor, logic, circuitry, etc.) and may generate and/or be responsive to any type of signal (e.g., analog, digital, pulses, etc.) in any state (e.g., high, low, any voltage level, etc.) to initiate a refresh operation.

The internal refresh command generator may be implemented by any quantity of any conventional or other devices (e.g., processor, logic, circuitry, etc.) and may generate and/or be responsive to any type of signal (e.g., analog, digital, pulses, etc.) in any state (e.g., high, low, any voltage level, etc.) to generate an internal refresh command. The refresh cycle counter may be implemented by any quantity of any conventional or other devices capable of determining and maintaining a count (e.g., logic, counters, circuitry, processor, arithmetic unit, etc.). The counter may be initialized and/or reset to any desired values, and may increment or decrement the count by any desired values. The counter may be responsive to any desired signals for initialization, resetting and applying increments or decrements to maintain a count of refresh cycles. The internal refresh command generator may be disabled in response to any suitable conditions or signals (e.g., signals from the test mode generator, the refresh cycle counter achieving a desired refresh cycle count, a timeout or inactivity for a predetermined time interval, etc.).

The refresh control circuit may be implemented by any quantity of any conventional or other devices (e.g., processor, logic, circuitry, etc.) and may be responsive to any type of signal (e.g., analog, digital, pulses, etc.) in any state (e.g., high, low, any voltage level, etc.) to perform a refresh operation. The refresh address counter may be implemented by any quantity of any conventional or other devices capable of determining and maintaining an address or count (e.g., logic, counters, circuitry, processor, arithmetic unit, etc.). The counter may be initialized and/or reset to any desired values, and may increment or decrement the address or count by any desired values. The counter may be responsive to any desired signals for initialization, resetting and applying increments or decrements to maintain a refresh address. The refresh control circuit may refresh any quantity of rows or word lines in any quantity of memory banks in any desired order or fashion (e.g., consecutively, a specified order, random, etc.).

The memory devices of the present invention may include any quantity of memory banks, each containing any quantity of memory cells arranged in any fashion (e.g., rows, columns, etc.) and storing any desired information. The memory cells may include any conventional or other components (e.g., transistors, capacitors, charge holding devices, etc.) arranged in any suitable configuration. The row and column decoders may be implemented by any quantity of any conventional or other devices (e.g., processor, logic, circuitry, decoders, etc.) and may be responsive to any type of address or other signal (e.g., analog, digital, pulses, etc.) in any state (e.g., high, low, any voltage level, etc.) to perform any memory operation (e.g., read, write, refresh, etc.).

The refresh cycle control blocks may be implemented by any quantity of any conventional or other devices (e.g., processor, logic, circuitry, etc.) and may be responsive to any type of signal (e.g., analog, digital, pulses, etc.) in any state (e.g., high, low, any voltage level, etc.) to control the refresh cycles. The test mode generator may be implemented by any quantity of any conventional or other devices capable of generating any types of appropriate signals (e.g., analog, digital, pulses, etc.) in any state (e.g., high, low, any voltage level, etc.) to control the refresh cycles. The test mode generator may provide any suitable information (e.g., enable signals, desired cycle quantities, etc.). The dynamic memory devices may include any quantity of test mode generators, where the test mode generators may be combined in any fashion to perform a desired test.

The logic units of the refresh cycle control blocks may be implemented by any quantity of any conventional or other devices (e.g., gates, circuitry, transistors, processor, etc.) and may perform any type of logic or other operation (e.g., AND, OR, NOR, NAND, XOR, addition, etc.). The logic units may include any quantity of inverted and/or non-inverted inputs and produce any types of appropriate signals (e.g., analog, digital, pulses, etc.) in any state (e.g., high, low, any voltage level, etc.). The compare unit may be implemented by any quantity of any conventional or other devices (e.g., logic, circuitry, comparator, processor, arithmetic unit, etc.) and may include any type of comparison or other operation (e.g., less than, greater than, equal to, less than or equal to, greater than or equal to, etc.). The compare unit may utilize any desired signals for a comparison (e.g., counts, etc.) and may produce any types of appropriate signals (e.g., analog, digital, pulses, etc.) in any state (e.g., high, low, any voltage level, etc.) in response to a comparison. The present invention may employ any desired values for the desired quantity of refresh cycles and/or refresh cycle count and any types of comparison or other operations to determine performance of the desired quantity of refresh cycles. For example, a refresh cycle counter may be initialized and/or reset to any desired value and incremented or decremented to any desired threshold to indicate completion of refresh cycles (e.g., the refresh cycle counter may be initialized and/or reset to N and decremented to zero to indicate completion of refresh cycles, the refresh cycle counter may be initialized and/or reset to zero and incremented to N to indicate completion of refresh cycles, etc.).

The present invention may employ any types of signals with any desired duration or timing (e.g., pulses of any desired pulse width, etc.). Further, the present invention may be employed to select any quantity of refresh cycles for a plural refresh cycle scheme. This may be accomplished by controlling any of the devices and/or signals initiating the refresh. For example, the present invention may determine when the appropriate or desired quantity of refresh cycles have been performed and disable the internal refresh command generator, row control block and/or refresh control circuit to prevent additional refresh cycles. Alternatively, the present invention may control (e.g., enable, disable, etc.) any of the various signals (e.g., internal refresh, internal refresh cycle enable, row refresh, etc.) to prevent additional refresh cycles.

The components, units or modules of the dynamic memory devices controlling the refresh cycles (e.g., state machine, refresh cycle control blocks, internal refresh command generator, row control block, refresh control circuit, etc.) may be disposed on or external of the chip or circuit platform housing the memory in any desired combinations or fashion. The functions of the various memory device components controlling the refresh cycles (e.g., state machine, refresh cycle control blocks, internal refresh command generator, row control block, refresh control circuit, etc.) may be combined in any manner and/or distributed among the memory device components, units or modules in any fashion.

From the foregoing description, it will be appreciated that the invention makes available a novel method and apparatus for controlling refresh cycles of a plural cycle refresh scheme in a dynamic memory, wherein a quantity of refresh cycles performed in response to a refresh command for a plural cycle refresh scheme are selectively controlled.

Having described preferred embodiments of a new and improved method and apparatus for controlling refresh cycles of a plural cycle refresh scheme in a dynamic memory, it is believed that other modification, variations and changes will be suggested to hose skilled in the art in view of the teachings set forth herein. It is therefore to be understood that all such variations, modifications and changes are believed to fall within the scope of the present invention as defined by the appended claims.

What is claimed is:

1. An apparatus to control refresh operation of a device employing a plural refresh cycle scheme, wherein said refresh scheme performs a plurality of refresh cycles of a predetermined quantity in response to a command initiating a refresh operation to maintain data storage, said apparatus comprising:
   a mode generator to supply information indicating a desired quantity of refresh cycles to be performed in response to said refresh initiating command; and
   a refresh enable unit to control said device to perform said desired quantity of refresh cycles within said refresh scheme in response to said refresh initiating command.

2. The apparatus of claim 1, wherein said desired quantity of refresh cycles is selectable by said mode generator and is one of a single refresh cycle and said predetermined quantity of refresh cycles, and said refresh enable unit controls said device to perform said selected refresh cycles in accordance with said desired quantity.

3. The apparatus of claim 2, wherein:
   said mode generator supplies a refresh enable signal to control generation of internal refresh commands, each internal refresh command initiating a refresh cycle; and
   said refresh enable unit includes a logic unit to control generation of said internal refresh commands in accordance with said refresh enable signal and identification of said refresh initiating command to enable performance of said desired quantity of refresh cycles in response to said refresh initiating command.

4. The apparatus of claim 2, wherein said mode generator and refresh enable unit control said device to perform said single refresh cycle in response to said refresh initiating command within a device test mode.

5. The apparatus of claim 1, wherein said device includes a dynamic memory.

6. The apparatus of claim 1, wherein said refresh initiating command includes an auto-refresh command.

7. The apparatus of claim 1, wherein said desired quantity of refresh cycles includes the quantities within the range from one to the predetermined quantity of refresh cycles.

8. The apparatus of claim 7, wherein:
   said mode generator supplies said desired quantity of refresh cycles; and
   said refresh enable unit includes:
      a compare unit to compare said desired quantity of refresh cycles to a quantity of refresh cycles performed in response to said refresh initiating command; and
      a logic unit to control performance of internal refresh commands in accordance with said comparison, wherein each internal refresh command initiates a refresh cycle to perform said plural refresh cycles within said refresh scheme, and wherein said logic unit disables said internal refresh commands in response to said comparison indicating said desired quantity of refresh cycles has been performed.

9. An apparatus to control refresh operation of a device employing a plural refresh cycle scheme, wherein said refresh scheme performs a plurality of refresh cycles of a predetermined quantity in response to a command initiating a refresh operation to maintain data storage, said apparatus comprising:
   mode generator means for supplying information indicating a desired quantity of refresh cycles to be performed in response to said refresh initiating command; and
   refresh enable means for controlling said device to perform said desired quantity of refresh cycles within said refresh scheme in response to said refresh initiating command.

10. The apparatus of claim 9, wherein said desired quantity of refresh cycles is selectable by said mode generator and is one of a single refresh cycle and said predetermined quantity of refresh cycles, and said refresh enable means includes control means for controlling said device to perform said selected refresh cycles in accordance with said desired quantity.

11. The apparatus of claim 10, wherein:
   said mode generator means supplies a refresh enable signal to control generation of internal refresh commands, each internal refresh command initiating a refresh cycle; and
   said refresh enable means includes logic means for controlling generation of said internal refresh commands in accordance with said refresh enable signal and identification of said refresh initiating command to enable performance of said desired quantity of refresh cycles in response to said refresh initiating command.

12. The apparatus of claim 10, wherein said mode generator means and refresh enable means control said device to perform said single refresh cycle in response to said refresh initiating command within a device test mode.

13. The apparatus of claim 9, wherein said device includes a dynamic memory.

14. The apparatus of claim 9, wherein said refresh initiating command includes an auto-refresh command.

15. The apparatus of claim 9, wherein said desired quantity of refresh cycles includes the quantities within the range from one to the predetermined quantity of refresh cycles.

16. The apparatus of claim 15, wherein:
said mode generator means supplies said desired quantity of refresh cycles; and
said refresh enable means includes:
compare means for comparing said desired quantity of refresh cycles to a quantity of refresh cycles performed in response to said refresh initiating command; and
logic means for controlling performance of internal refresh commands in accordance with said comparison, wherein each internal refresh command initiates a refresh cycle to perform said plural refresh cycles within said refresh scheme, and wherein said logic means disables said internal refresh commands in response to said comparison indicating said desired quantity of refresh cycles has been performed.

17. A method of controlling refresh operation of a device employing a plural refresh cycle scheme, wherein said refresh scheme performs a plurality of refresh cycles of a predetermined quantity in response to a command initiating a refresh operation to maintain data storage, said method comprising:
supplying information indicating a desired quantity of refresh cycles to be performed in response to said refresh initiating command; and
controlling said device to perform said desired quantity of refresh cycles within said refresh scheme in response to said refresh initiating command.

18. The method of claim 17, wherein said desired quantity of refresh cycles is selectable by said mode generator and is one of a single refresh cycle and said predetermined quantity of refresh cycles, and said method further includes controlling said device to perform said selected refresh cycles in accordance with said desired quantity.

19. The method of claim 18, wherein:
said supplied information includes a refresh enable signal to control generation of internal refresh commands, each internal refresh command initiating a refresh cycle; and
said method further includes controlling generation of said internal refresh commands in accordance with said refresh enable signal and identification of said refresh initiating command to enable performance of said desired quantity of refresh cycles in response to said refresh initiating command.

20. The method of claim 18, wherein said method further includes controlling said device to perform said single refresh cycle in response to said refresh initiating command within a device test mode.

21. The method of claim 17, wherein said device includes a dynamic memory.

22. The method of claim 17, wherein said refresh initiating command includes an auto-refresh command.

23. The method of claim 17, wherein said desired quantity of refresh cycles includes the quantities within the range from one to the predetermined quantity of refresh cycles.

24. The method of claim 23, wherein said supplied information includes said desired quantity of refresh cycles, and said method further includes:
comparing said desired quantity of refresh cycles to a quantity of refresh cycles performed in response to said refresh initiating command; and
controlling performance of internal refresh commands in accordance with said comparison, wherein each internal refresh command initiates a refresh cycle to perform said plural refresh cycles within said refresh scheme, and wherein said internal refresh commands are disabled in response to said comparison indicating said desired quantity of refresh cycles has been performed.

25. A device including a storage unit and employing a refresh scheme to maintain data storage, wherein said refresh scheme performs a plurality of refresh cycles of a predetermined quantity in response to a command initiating a refresh operation and said device controls the quantity of refresh cycles performed within that scheme in response to said refresh initiating command, said device comprising:
a storage unit to store data, wherein said storage unit is refreshed to maintain said data;
a decoder to decode received commands and identify said refresh initiating command;
an internal refresh command generator to generate internal refresh commands, each initiating a refresh cycle, to perform plural refresh cycles within said refresh scheme;
a row address block to initiate a refresh operation in response to at least one of said identified refresh initiating command and said internal refresh command;
a refresh control circuit, responsive to said row control block, to refresh said storage unit;
a mode generator to supply information indicating a desired quantity of refresh cycles to be performed in response to said refresh initiating command; and
a refresh enable unit to control said refresh scheme to perform said desired quantity of refresh cycles in response to said identified refresh initiating command.

26. The device of claim 25, wherein said desired quantity of refresh cycles is selectable by said mode generator and is one of a single refresh cycle and said predetermined quantity of refresh cycles, and said refresh enable unit controls said device to perform said selected refresh cycles in accordance with said desired quantity.

27. The device of claim 26, wherein:
said mode generator supplies a refresh enable signal to control generation of said internal refresh commands by said internal refresh command generator; and
said refresh enable unit includes a logic unit to control said internal command generator to generate said internal refresh commands in accordance with said refresh enable signal and said identified refresh initiating command to enable performance of said desired quantity of refresh cycles in response to said identified refresh initiating command.

28. The device of claim 26, wherein said refresh enable unit controls said refresh scheme to perform said single refresh cycle in response to said refresh initiating command within a device test mode.

29. The device of claim 25, wherein said device includes a dynamic memory.

30. The device of claim 25, wherein said refresh initiating command includes an auto-refresh command.

31. The device of claim 25, wherein said desired quantity of refresh cycles includes the quantities within the range from one to the predetermined quantity of refresh cycles.

32. The device of claim 31, wherein:
said mode generator supplies said desired quantity of refresh cycles; and
said refresh enable unit includes:
a compare unit to compare said desired quantity of refresh cycles to a quantity of refresh cycles performed in response to said refresh initiating command; and
a logic unit to control performance of said internal refresh commands generated by said internal refresh command generator in accordance with said comparison, wherein said logic unit disables said internal refresh commands in response to said comparison indicating said desired quantity of refresh cycles has been performed.

33. A device including a storage unit and employing a refresh scheme to maintain data storage, wherein said refresh scheme performs a plurality of refresh cycles of a predetermined quantity in response to a command initiating a refresh operation and said device controls the quantity of refresh cycles performed within that scheme in response to said refresh initiating command, said device comprising:
storage means for storing data, wherein said storage means is refreshed to maintain said data;
command means for decoding received commands and identifying said refresh initiating command;
command generator means for generating internal refresh commands, each initiating a refresh cycle, to perform plural refresh cycles within said refresh scheme;
refresh control means for initiating a refresh operation in response to at least one of said identified refresh initiating command and said internal refresh command;
refresh means, responsive to said refresh control means, for refreshing said storage means;
mode generator means for supplying information indicating a desired quantity of refresh cycles to be performed in response to said refresh initiating command; and
refresh enable means for controlling said refresh scheme to perform said desired quantity of refresh cycles in response to said identified refresh initiating command.

34. The device of claim 33, wherein said desired quantity of refresh cycles is selectable by said mode generator and is one of a single refresh cycle and said predetermined quantity of refresh cycles, and said refresh enable means controls said refresh scheme to perform said selected refresh cycles in accordance with said desired quantity.

35. The device of claim 34, wherein:
said mode generator means supplies a refresh enable signal to control generation of said internal refresh commands by said command generator means; and
said refresh enable means includes logic means for controlling said command generator means to generate said internal refresh commands in accordance with said refresh enable signal and said identified refresh initiating command to enable performance of said desired quantity of refresh cycles in response to said identified refresh initiating command.

36. The device of claim 34, wherein said refresh enable means controls said refresh scheme to perform said single refresh cycle in response to said refresh initiating command within a device test mode.

37. The device of claim 33, wherein said device includes a dynamic memory.

38. The device of claim 33, wherein said refresh initiating command includes an auto-refresh command.

39. The device of claim 33, wherein said desired quantity of refresh cycles includes the quantities within the range from one to the predetermined quantity of refresh cycles.

40. The device of claim 39, wherein:
said mode generator means supplies said desired quantity of refresh cycles; and
said refresh enable means includes:
compare means for comparing said desired quantity of refresh cycles to a quantity of refresh cycles performed in response to said refresh initiating command; and
logic means for controlling performance of said internal refresh commands generated by said command generator means in accordance with said comparison, wherein said logic means disables said internal refresh commands in response to said comparison indicating said desired quantity of refresh cycles has been performed.

41. A method of controlling a device to perform a desired quantity of refresh cycles within a plural cycle refresh scheme in response to a command initiating a refresh operation, wherein said device includes a storage unit and employs a refresh scheme to maintain data storage, and wherein said refresh scheme performs a plurality of refresh cycles of a predetermined quantity in response to said refresh initiating command, said method comprising:
storing data within said storage unit, wherein said storage unit is refreshed to maintain said data;
supplying information indicating a desired quantity of refresh cycles to be performed in response to said refresh initiating command;
decoding received commands and identifying said refresh initiating command;
generating internal refresh commands, each initiating a refresh cycle, to perform plural refresh cycles within said refresh scheme for said identified refresh initiating command;
initiating a refresh operation in response to at least one of said identified refresh initiating command and said internal refresh command; and
controlling said refresh scheme to perform said desired quantity of refresh cycles in response to said identified refresh initiating command.

42. The method of claim 41, wherein said desired quantity of refresh cycles is selectable by said mode generator and is one of a single refresh cycle and said predetermined quantity of refresh cycles, and said method further includes controlling said refresh scheme to perform said selected refresh cycles in accordance with said desired quantity.

43. The method of claim 42, wherein:
said supplied information includes a refresh enable signal to control generation of said internal refresh commands; and
said method further includes controlling generation of said internal refresh commands in accordance with said refresh enable signal and said identified refresh initiating command to enable performance of said desired quantity of refresh cycles in response to said identified refresh initiating command.

44. The method of claim 42, wherein said method further includes controlling said refresh scheme to perform said single refresh cycle in response to said refresh initiating command within a device test mode.

45. The method of claim 41, wherein said device includes a dynamic memory.

46. The method of claim 41, wherein said refresh initiating command includes an auto-refresh command.

47. The method of claim 41, wherein said desired quantity of refresh cycles includes the quantities within the range from one to the predetermined quantity of refresh cycles.

48. The method of claim 47, wherein:
  said supplied information includes said desired quantity of refresh cycles; and
  said method further includes:
    comparing said desired quantity of refresh cycles to a quantity of refresh cycles performed in response to said refresh initiating command; and
    controlling performance of said internal refresh commands in accordance with said comparison, wherein said internal refresh commands are disabled in response to said comparison indicating said desired quantity of refresh cycles has been performed.

\* \* \* \* \*